United States Patent [19]
Doemen

[11] Patent Number: 5,963,024
[45] Date of Patent: Oct. 5, 1999

[54] SWITCHED MODE POWER SUPPLY

[75] Inventor: Benno Doemen, St. Georgen, Germany

[73] Assignee: Papst-Motoren GmbH & Co. KG, St. Georgen, Germany

[21] Appl. No.: 08/992,302

[22] Filed: Dec. 17, 1997

[30] Foreign Application Priority Data

Dec. 17, 1996 [DE] Germany ........................ 296 21 905 U

[51] Int. Cl.$^6$ ................................ G05F 1/10; G05F 1/40; H02M 5/42
[52] U.S. Cl. .......................... 323/282; 323/285; 323/222; 363/89
[58] Field of Search .................... 323/282, 284, 323/285, 222; 363/89

[56] References Cited

U.S. PATENT DOCUMENTS

| | | | |
|---|---|---|---|
| 4,994,954 | 2/1991 | Katz et al. ................................. | 363/89 |
| 5,301,095 | 4/1994 | Teramoto et al. ......................... | 363/89 |
| 5,424,932 | 6/1995 | Inou et al. ................................. | 363/89 |
| 5,574,357 | 11/1996 | Otake et al. .............................. | 323/222 |
| 5,689,178 | 11/1997 | Otake ....................................... | 323/282 |
| 5,726,871 | 3/1998 | Choi ......................................... | 363/89 |
| 5,777,866 | 7/1998 | Jacobs et al. ............................. | 363/89 |

FOREIGN PATENT DOCUMENTS

| | | | |
|---|---|---|---|
| 0095724 | 5/1983 | European Pat. Off. ........ | H02M 3/155 |
| 3640603 | 11/1986 | Germany ........................ | H02M 3/156 |
| 3908338 | 3/1989 | Germany ........................ | H02M 3/10 |
| 63-114567 | 5/1988 | Japan ............................. | H02M 3/155 |
| 4140059 | 5/1992 | Japan ............................. | H02M 3/155 |

*Primary Examiner*—Peter S. Wong
*Assistant Examiner*—Bao Q. Vu
*Attorney, Agent, or Firm*—Harness, Dickey & Pierce

[57] ABSTRACT

The present invention concerns a switched mode power supply with a timed switching regulator (1), whereby an electronic switching component ($T_1$) is periodically switched on and off in such a particular pulse duty ratio, that an output control voltage ($U_B$) is produced from a rectified input voltage ($U_E$) across a storage circuit (2) with a smoothing choke (L), an intermediate circuit memory backup capacitor ($C_Z$), and a free-wheeling diode ($D_F$). The switching component ($T_1$) is composed of a transistor, namely an FET or an IGBT, whose base or gate (G) is preconnected to a special control circuit (4) in such a way that an increased trigger current briefly flows in the trigger circuit for gating, and a substantially smaller holding current subsequently flows in the gated state, respectively.

16 Claims, 3 Drawing Sheets

SWITCHED MODE POWER SUPPLY

BACKGROUND AND SUMMARY OF THE INVENTION

The present invention concerns a switched mode power supply with a timed switching regulator, whereby an electronic switching component is periodically switched on and off in such a particular pulse duty ratio/duty cycle, that an output control voltage is produced from a rectified input voltage across a storage circuit with a smoothing choke, an intermediate circuit memory backup capacitor, and a freewheeling diode.

Such switched mode power supplies (switching regulators) are known in the art. Their advantages are: relatively high efficiency, relatively small filtering overhead because of the high clock frequency, and a large range of input voltages. The disadvantages: the use of special, sometimes very expensive, components, (among other things, special smoothing chokes with special ferrite core and possibly at least two windings), required for the control circuit. Because of the given disadvantages, the economic considerations above all, such switched mode power supplies are not yet used for all applications in which they would be well suited in principle from a technical point of view.

The present invention therefore takes as its basis, the objective of creating a switched mode power supply of the type cited, which is suitable for a larger range of applications due to a substantial reduction of the costs, yet has at least a satisfactory efficiency and reasonably high output power.

This is achieved in accordance with the invention in that, the switching component is composed of a transistor, namely a FET (field effect transistor) or an IGBT (insulated gate bipolar transistor), whose gate or base is preconnected to a special control circuit in such a way that an increased trigger current briefly flows in the trigger circuit for gating the switching component, and a substantially smaller holding current subsequently flows in the gated state, respectively. For this purpose, an active dropping resistor is appropriately preconnected to the gate, whereby, dynamically at the time when the switching component is triggered, the active dropping resistor is at least partially bridged (and thereby made lower-impedance) by the control circuit in accordance with the invention in such a way, that the relatively high trigger current flows for this time, while the bridging of the active dropping resistor is subsequently raised after the gating of the switching component, so that the relatively smaller holding current flows.

The invention is based on the knowledge that the electronic switching component (FET/IGBT) needs a relatively large trigger energy ("starting charge"), because very large internal capacitances operate between the principal current path (drain/source or emitter/collector) and the base or gate, and the switching component can only become conductive (gating control) as fast as these internal capacitances can be charged. It is therefore necessary to ensure that a sufficiently large current can flow in the trigger circuit within a very short time (few microseconds). Here, the dropping resistor could be conceived in principle as being in a correspondingly low-impedance state (for example, a current flow of at least 30 mA at 230 V), whereby it would be designed for very large dissipation power (strong heating).

It can be achieved by the present invention, however, that the active dropping resistor as a whole, i.e. when accumulated, can be of relatively high-impedance, so that the current, as a holding current, is also insignificantly small in the normal case, i.e. in the switching component's gated on state. A large trigger current is then briefly produced in practice as an amplified current pulse across the control circuit in accordance with the invention for gating the switching component, however, so that it represents a "trigger pulse amplifier" so to speak. For this, a capacitor is preferably used as an energy storage device, which (at least) briefly bridges part of an active dropping resistor, preferably designed as a voltage divider, in the gate-triggering current path or resistor path.

The invention has the advantage that no "active" circuit is needed for producing an auxiliary voltage. Rather, the circuit in accordance with the invention manages mainly with passive and therefor inexpensive components. Because of the very low power, low-priced resistance classes can be used for the resistors of the active dropping resistor. A very inexpensive switching transistor (e.g. BSR 19) can be used as the (single) active component of the control circuit in accordance with the invention.

In connection with the invention, it is furthermore preferable, if the electronic switching component forms a multivibrator circuit together with a flip-flop transistor (current mode transistor), whereby this multivibrator circuit is current-controlled by a control resistor and, therefore advantageously short-circuit protected, is triggered by a control signal. A small-signal transistor (e.g. BC 847) which is likewise very inexpensive, can be used for the flip-flop transistor. Here it is preferable for the control signal to be coupled back free of voltage potential from the side of the output control voltage, particularly by an optical coupling device, into the switching regulator's control loop. This saves a second, very expensive winding on the smoothing choke, so that a very inexpensive smoothing choke with only one winding and therefore also with a very small expense for insulation can be implemented (bar choke or choking coil annular type).

Further advantageous organizational characteristics of the invention are contained in the dependent claims and in the following description.

DETAILED DESCRIPTION OF THE PREFERRED EMBODIMENT

Figure 1:
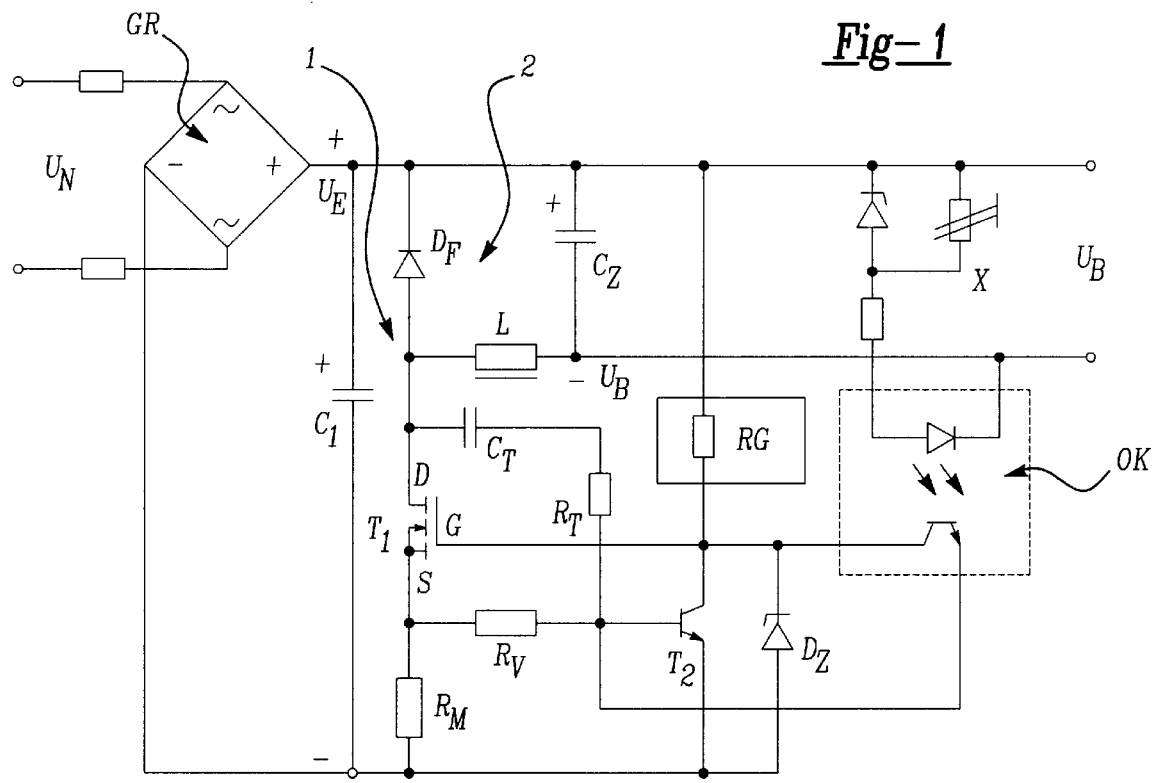
FIG. 1 is a circuit diagram of a switched mode power supply provided to explain its basic operational method.

In accordance with FIG. 1, an input-side alternating voltage, usually a line voltage $U_N$, is rectified by a rectifier GR and preferably smoothed by a parallel capacitor $C_1$. A rectified input voltage $U_E$ occurs, from which an output control voltage $U_B$ is produced by means of a clocked switching regulator 1.

This occurs, in a way known in its own right, in that an electronic switching component $T_1$. is periodically switched on and off in a particular pulse duty ratio/duty cycle corresponding to the desired control voltage. Here the switching component $T_1$ cooperates with a storage circuit 2, which consists of a smoothing choke L, an intermediate circuit memory backup capacitor $C_Z$, and a free-wheeling diode $D_F$. This is basically the state of the art and therefor requires no further explanation.

In the presented embodiment, the switching component $T_1$ is a FET whose source terminal S is connected with the negative line "–" by a control resistor $R_M$, and whose drain terminal D is connected with both the smoothing choke L and the positive line "+" by the free-wheeling diode $D_F$. The other terminal of the smoothing choke L forms the negative line $-U_B$ of the output control voltage $U_B$. The memory backup capacitor $C_Z$ lies between the positive line and $-U_B$.

An active dropping resistor $R_G$ is preconnected to the gate terminal G of the switching component $T_1$ in the representation according to FIG. 1. As was already explained in the introduction, this individual resistor would have to be designed of low-impedance and therefore for high power.

Figure 2:
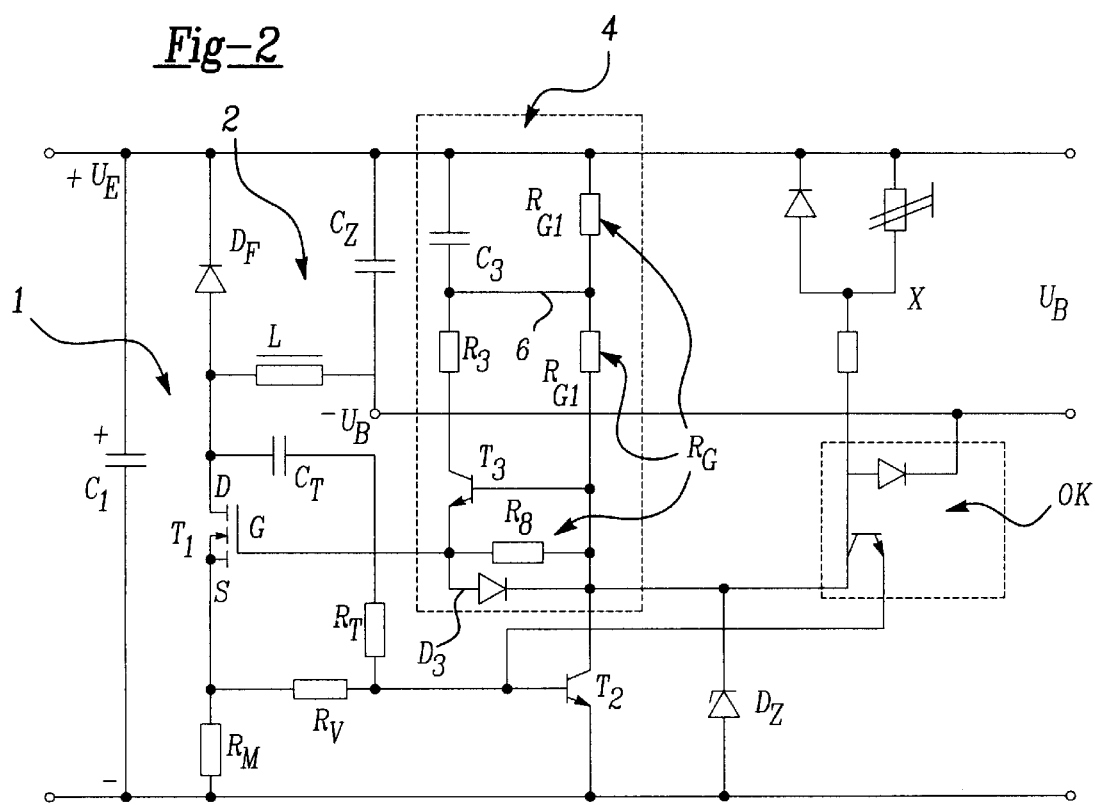
FIG. 2 is a circuit diagram of a switched mode power supply in accordance with the invention in a first embodiment of the special control circuit.

In accordance with FIG. 2, a special control circuit 4, framed by a dashed line for emphasis, is therefore provided at this location in accordance with the invention. Moreover, the active dropping resistor $R_G$ is composed as a voltage divider of at least two individual resistors. In accordance with FIG. 2 it is composed of 3 individual resistors $R_{G1}$, $R_{G2}$, and $R_B$. The base emitter connection of a control transistor $T_3$ is parallel to the last individual transistor $R_B$ mentioned, whereby the resistor $R_B$ is designed in such a way, that a voltage drops by a fixed amount (e.g. in the range of 0.7 up to 2 V) when there is a current flow across the entire active dropping resistor at $R_B$ in any case, so that the control transistor $T_3$ can thereby gate on. The control transistor $T_3$ with its principal current path, its collector-emitter connection, lies parallel to the active dropping resistor $R_G$ in a secondary branch. In this secondary branch, a protecting resistor $R_3$ and a capacitor $C_3$, as an energy storage device, are arranged in series between collector and the positive line. It is advantageous for the point between the individual resistors $R_{G1}$ and $R_{G2}$ of the active dropping resistor to be connected with the point between the capacitor $C_3$ and the protecting resistor $R_3$ by a direct connection 6. In addition, a discharging diode $D_3$ is parallel to the base emitter connection of the control transistor $T_3$ and parallel to the individual resistor $R_B$. The function of this control circuit which is in accordance with the invention will be explained even more exactly below.

As can be determined from all of the drawings, the electronic switching component $T_1$, together with a second transistor $T_2$, here called a flip-flop transistor, forms a multivibrator circuit which is current-controlled by the control resistor $R_M$, and is therefore advantageously short-circuit protected. Here the multivibrator circuit $T_1/T_2$ is triggered by a control or regulating signal X. This control signal X is preferably coupled back into the switching regulator's control loop free of voltage potential from the side of the output control voltage $U_B$, especially by an optical coupling device OK. Here the optical coupling device OK is connected on the primary side with $-U_B$ on one hand and with the positive line by a resistor and a Zener diode on the other hand. The control signal X is derived here. In FIGS. 1 and 2, this is illustrated in simplified form by a sketched potentiometer. The optical coupling device OK is connected on the secondary side with the base of the flip-flop transistor $T_2$ on the one hand, and advantageously with a voltage divider tap between two individual resistors ($R_{G2}$ and $R_B$ in accordance with FIGS. 1 and 2, or $R_{G21}$ and $R_{G22}$ in accordance with FIG. 3) of the active dropping resistor $R_G$ on the other hand. Moreover, the base of the flip-flop transistor $T_2$ is connected with the drain terminal D of the switching component $T_1$ by a series RC component consisting of a resistor $R_T$ and a capacitor $C_T$ on one hand, and, by a dropping resistor $R_V$ in particular, with a breakover point between the control resistor $R_M$ and the source terminal S of the switching component $T_1$ on the other hand. The flip-flop transistor $T_2$ with its collector-emitter connection lies between the gate terminal G of the switching component $T_1$, and preferably namely a voltage divider tap between two individual resistors $R_B$ and $R_{G2}$ or $R_{G22}$, on the one hand, and the negative line on the other hand. Moreover, a Zener diode $D_Z$ is parallel to the collector-emitter connection of the flip-flop transistor.

The operation will be explained in more detail with the help of FIG. 2. The active dropping resistor $R_G$ is conceived as a relatively high impedance compared to the total from the individual resistors, so that only a very small current can still flow across this branch. If the output control voltage $U_B$ now drops below the setpoint value at a particular time, the flip-flop transistor $T_2$ is blocked by the corresponding regulating signal X, thereby making the switching component $T_1$ conductive. A very small current of only 1 through 1.5 mA, for example, thereby flows across the active dropping resistor $R_G$, which, without any special measures, is completely without problems regarding power dissipation. Moreover, the control transistor $T_3$ then becomes conductive relatively quickly, caused by the voltage drop at $R_B$. If $T_3$ becomes conductive, a relatively large current will flow across its collector-emitter connection and across $C_3$ and $R_3$ (which, with 1.5 kΩ for example, is negligibly small and only serves to protect $T_3$ from short-circuits) which is parallel to the $R_G$ branch into gate G of $T_1$. A large gate trigger power pulse is thereby made available ("pulse amplifier"). The capacitances of the switching component $T_1$ are thereby charged very quickly, so that $T_1$ gates very swiftly. This charging current then stops and the control transistor $T_3$ blocks according to an exponential-function. In the further course of events, the gated state of $T_1$ is then maintained by the series connection $R_G$, toward which only an extremely reduced current of several microamps still flows, which is completely irrelevant to the dissipated power. After $T_1$ has been gated for a particular time interval, the disconnection then occurs, depending on the control signal X, by the gating of the flip-flop transistor $T_2$. The gate G of the switching component $T_1$ is thereby discharged across the discharging diode $D_3$.

The basic operation can be described briefly and simply as follows:

If the voltage $U_B$ drops below the setpoint value and blocks $T_2$, so that $T_1$ becomes conductive, a current will flow across $R_G$ ($R_{G1}$, $R_{G2}$, and $R_B$) into gate G. $T_3$ thereby becomes conductive and draws a relatively large current from $C_3$ (and $R_{G1}$) across $R_3$ for charging the gate capacitances ($Q_G$ approximately 20 nC), and $T_1$ can be gated with an arbitrarily steep edge. If the gate capacitances are charged, the current across $R_B$ becomes so small, that it blocks $T_3$. $C_3$ has sufficient time to discharge itself across $R_{G1}$ with the voltage divider ratio $R_{G1}/R_{G2}$. If the current across $R_M$ drives the flip-flop transistor $T_2$ into conductive state, the gate can be rapidly discharged across $D_3$. The switching over is supported by the $R_T/C_T$ circuit component.

Advantageous organizational characteristics will now be explained with the help of FIG. 3. The control or adjusting signal X comes here from a user outside the drawing, which explains why it is labeled XW in FIG. 3. This embodiment is particularly suitable for supplying electromotors, fan motors with intermeshed control loop, for example. Here the motor's control loop or speed controller controls the switched mode power supply's preset-control loop in such a way that the motor steadily receives a voltage slightly larger than it really needs. Here it is guaranteed that the motor's actual speed control has a sufficiently large voltage available continuously.

Figure 3:
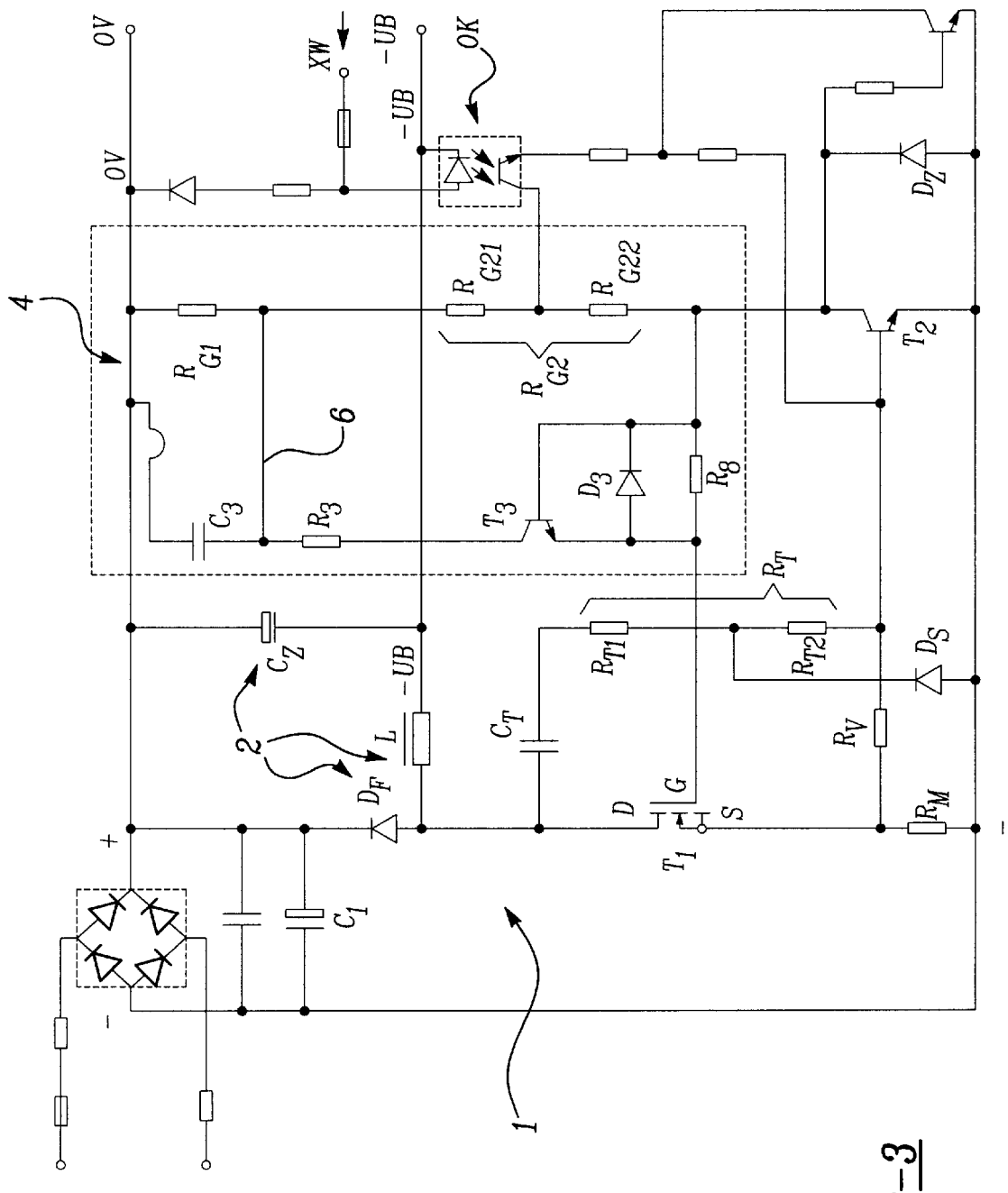
FIG. 3 is a more detailed circuit diagram of the switched mode power supply in accordance with the invention with advantageous organizational characteristics.

In accordance with FIG. 3, the individual resistor $RG_2$ is furthermore divided into two resistors $R_{G21}$ and $R_{G22}$. The breakover point between these two resistors serves for connecting the secondary circuit of the optical coupling device OK.

Finally, a particular engineering measure will be explained more exactly. Let us first provide the following background: When the switching component $T_1$ goes into the blocked state, $C_T$ is charged to full voltage, whereby the resistors limit the current. When $T_1$ becomes conductive, it would reverse the voltage of $C_T$, so that −200 V, for example, would be applied near the base of $T_2$. This would destroy $T_2$. To prevent this, it is appropriately provided, that the resistor $R_T$ is made as a voltage divider consisting of two component resistors $R_{T1}$ and $R_{T2}$, and namely in a very asymmetrical partitioning ratio of approximately 1:10. A protective diode $D_S$ is connected into the voltage divider tap. Its other side is connected to the negative line. When $T_1$ now blocks, the protective diode $D_S$ basically becomes nonconductive. It has the effect of a "normal" $R_T/C_T$ component, for guaranteeing that the flip-flop transistor $T_1$ becomes conductive. When the switching component $T_1$ becomes conductive again, it draws the current across the protective diode $D_S$ and the smaller component resistor $R_{T1}$, thereby recharging the capacitor $C_T$. A negative voltage of only 0.7 to 1.1 V, for example, therefore is applied at the base of $T_2$ across the component resistor $R_{T2}$ which is approximately ten times higher. This is insignificant to the large dropping resistor. In fact, the opposite is preferable, because $T_2$ therefore blocks very firmly. This measure moreover leads to the second advantage, that unequal timing constants come into effect in the timing circuit. During the relatively brief conducting phases of $T_1$, $C_T$ must be recharged or discharged, respectively, which proceeds across the diode $D_S$ and only across the smaller resistor $R_{T1}$. For charging, however, both component resistors $R_{T1}+R_{T2}$ operate to maintain the conduction of $T_2$.

In conclusion, several quantitative magnitudes will be provided by way of example for the components of the circuit in accordance with the invention.

$R_{G1}$=82 kΩ, $R_{G2}$=44 kΩ(2×22 KΩ), $R_B$=22 kΩ, $R_3$=1.5 kΩ, $C_3$=220 picoFarads, $D_3$=e.g. BAS 216, $R_{T1}$=15 kΩ, $R_{T2}$=160 kΩ, $C_T$=220 picoFarads.

The invention first of all leads to the advantage of a decisive cost reduction. The power supply unit in accordance with the invention can be offered at a significantly lower cost than conventional power supply units of comparable power, so that it offers itself for many applications. In spite of the extremely low costs, the switching regulator in accordance with the invention is suitable for a large range of applications ($U_N$=90 to 264 VAC) and a large range of controllable low output voltages (UB=120 to 375 V DC), whereby a small power loss is also to be observed.

Several more variations of the embodiment of the control circuit 4 in accordance with the invention are depicted in FIGS. 4 through 7. All variations of the embodiment have in common that (at least) one capacitor is arranged as an energy storage device parallel to a discharging resistor and thereby bridges this discharging resistor intermittently.

Figure 4:
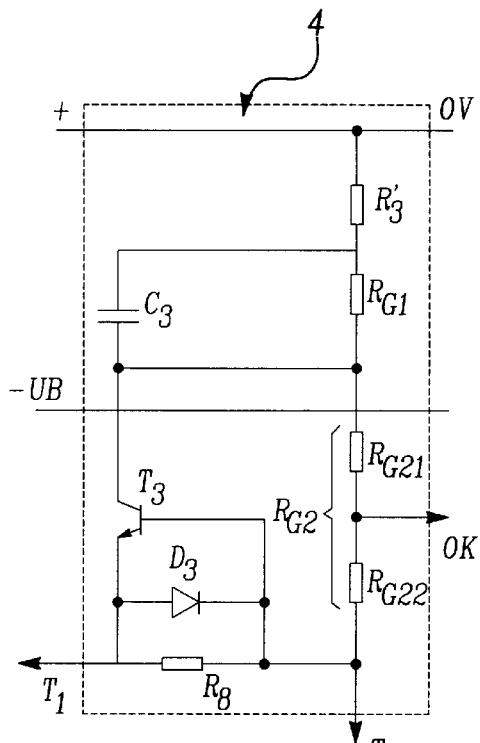
FIGS. 4 through 7 illustrate further embodiments of the control circuit in accordance with the present invention.

In the case of FIG. 4, the capacitor $C_3$ is parallel to the resistor $R_{G1}$, and in series to the collector of the control resistor $T_3$. A protecting resistor $R'_3$ is additionally provided here between the capacitor $C_3$ and the positive line, whereby the resistor $C_3$ only needs to be designed for a relatively small voltage.

Figure 5:
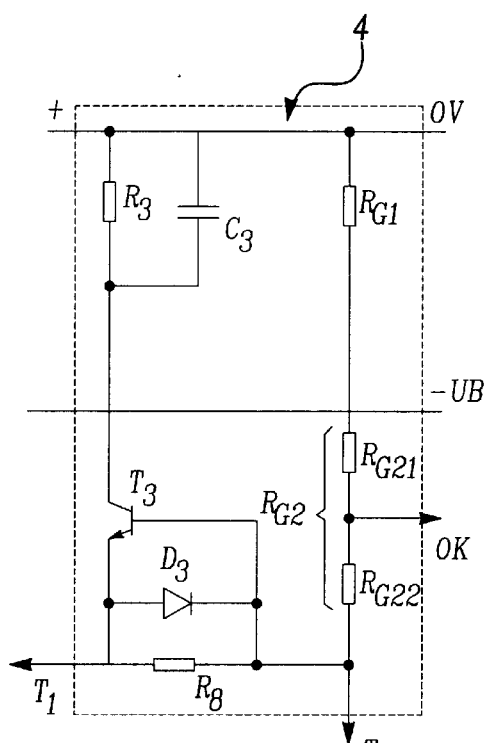

In accordance with FIG. 5, a parallel connection consisting of the resistor $R_3$ and the capacitor $C_3$ is preconnected to the collector of the transistor $T_3$. Here the transistor $T_3$ would of course have to be designed for the full collector/emitter voltage.

Figure 6:
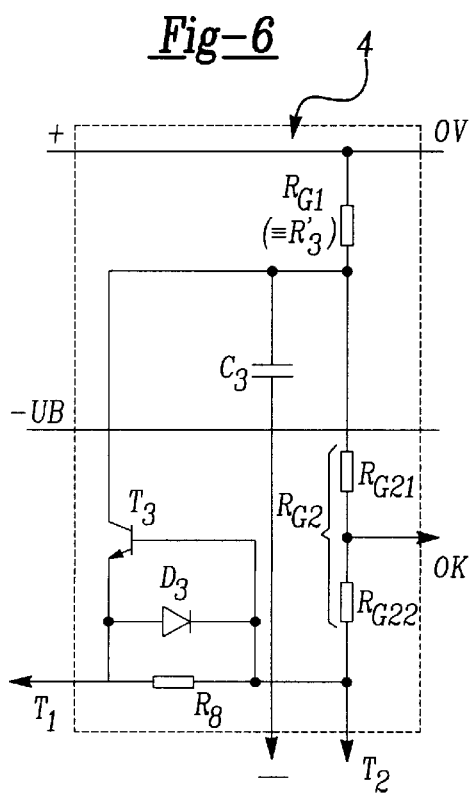
Figure 7:
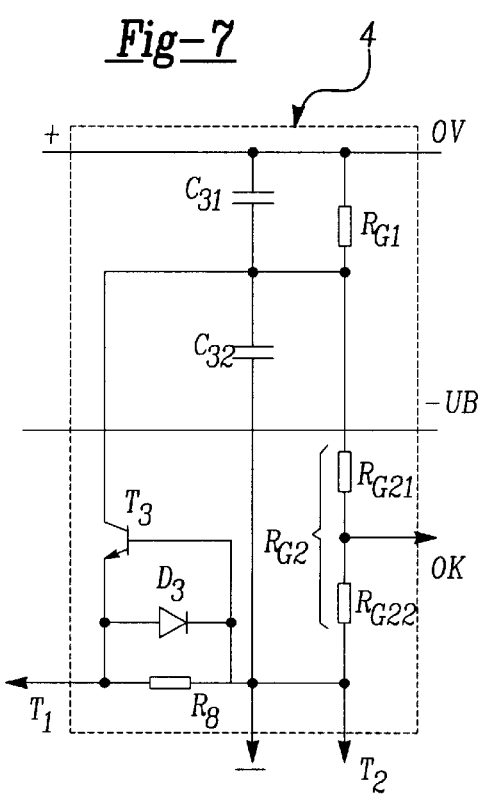

For the embodiments according to FIGS. 6 and 7 respectively, the energy storage capacitor is arranged parallel to a part of the voltage divider. In accordance with FIG. 6, the capacitor $C_3$ lies parallel to the resistor $R_{G2}$ between the voltage divider's middle tap and the negative line.

In accordance with FIG. 7, the energy storage capacitor is divided into two component capacitances $C_{31}$, and $C_{32}$, which form a capacitive voltage divider, which is connected in parallel to the ohmic voltage divider.

Let it still be mentioned in accordance with FIG. 6, that the voltage divider's resistor $R_{G1}$ also operates simultaneously as a protecting resistor $R'_3$ for the transistor $C_3$. Analogously to FIG. 5, the transistor $C_3$ in FIG. 7 must again be designed for the full C/E voltage.

The invention is not limited to the concretely described examples, but also includes all embodiments which work in the same way as the invention. The invention is furthermore not yet restricted so far to the combination of characteristics defined in claim 1, but can also be defined by any other arbitrary combination of particular characteristics of all the disclosed individual characteristics as a whole. This means in principle, that practically every individual characteristic of claim 1 can be omitted and replaced by at least one individual characteristic disclosed at another place in the application. In this respect, claim 1 is to be understood merely as an initial attempt at formulation for an invention.

It is to be understood that the invention is not limited to the exact construction illustrated and described above, but that various changes and modifications may be made without departing from the spirit and scope of the invention as defined in the following claims.

I claim:

1. Switched mode power supply with a timed switching regulator(1), whereby an electronic switching component ($T_1$) is periodically switched on and off in such a particular pulse duty ratio, that an output control voltage ($U_B$) is produced from a rectified input voltage ($U_E$) across a storage circuit (2) with a smoothing choke (L), an intermediate circuit memory backup capacitor ($C_Z$), and a free-wheeling diode ($D_F$) characterized in that, the switching component ($T_1$) is composed of a transistor, namely an FET or an IGBT, whose base or gate (G) is preconnected to a control circuit (4) in such a way that an increased trigger current briefly flows in the trigger circuit for gating, and a substantially smaller holding current subsequently flows in the gated state, respectively, whereby the increased trigger current charges inherent semiconductor capacitances in the transistor to enable faster gating by the transistor.

2. Switched mode power supply according to claim 1, characterized in that the control circuit (4) dynamically, depending on the respective gate-current, briefly amplifies the trigger current from an energy storage device ($C_3$) as a pulse.

3. Switched mode power supply according to claim 1, characterized in that, the energy storage device is at least one capacitor ($C_3/C_{31}$, $C_{32}$) with at least one discharging resistor ($R_{G1}$; $R_3$; $R_{G21}$; $R_{G22}$) connected in parallel.

4. Switched mode power supply with a timed switching regulator(1), whereby an electronic switching component ($T_1$) is periodically switched on and off in such a particular pulse duty ratio, that an output control voltage ($U_B$) is produced from a rectified input voltage ($U_E$) across a storage circuit (2) with a smoothing choke (L), an intermediate circuit memory backup capacitor ($C_Z$), and a free-wheeling diode ($D_F$) characterized in that, the switching component ($T_1$) is composed of a transistor, namely an FET or an IGBT, whose base or gate (G) is preconnected to a control circuit (4) in such a way that an increased trigger current briefly flows in the trigger circuit for gating, and a substantially smaller holding current subsequently flows in the gated state, respectively and wherein an active dropping resistor ($R_G$) is preconnected to the gate (G) of the switching component ($T_1$), whereby, dynamically at the time when the switching component ($T_1$) is triggered, the active dropping resistor ($R_G$) is at least partially bridged by the control circuit (4) in such a way, that the relatively high trigger current flows for this time, while the bridging of the active dropping resistor ($R_G$) is subsequently raised after the gating of the switching component ($T_1$), so that the relatively smaller holding current flows.

5. Switched mode power supply according to claim 4, characterized in that, the active dropping resistor connection ($R_G$) is composed as a voltage divider of at least two individual resistors, preferably of at least 3 individual resistors ($R_{G1}$, $R_{G2}$, $R_B$), of which at least one ($R_B$) is parallel to the base emitter connection of a control resistor ($T_3$).

6. Switched mode power supply according to claim 5, characterized in that, the energy storage device ($C_3$) is parallel to a part of the active dropping resistor designed as a voltage divider.

7. Switched mode power supply according to claim 5, characterized in that, the control transistor ($T_3$) with its collector-emitter connection is in a secondary branch parallel to at least one part of the active dropping resistor ($R_G$).

8. Switched mode power supply according to claim 7, characterized in that a capacitor ($C_3$) and a protecting resistor ($R_3$) are arranged in series in the secondary branch, and whereby the point between two individual resistors ($R_{G1}$, $R_{G2}$) of the active dropping resistor ($R_G$) is preferably connected with the point between the capacitor ($C_3$) and the protecting resistor ($R_3$) by a direct connection (6).

9. Switched mode power supply according to claim 5, characterized in that a discharging diode ($D_3$) for discharging the gate (G) of the switching component ($T_1$) is connected in parallel to the base emitter connection of the control transistor ($T_3$) and parallel to the individual resistor ($R_B$).

10. Switched mode power supply according to claim 9, characterized in that the electronic switching component ($T_1$) forms a multivibrator circuit together with a flip-flop transistor ($T_2$), whereby this multivibrator circuit ($T_1/T_2$) is current-controlled by a control resistor ($R_M$) and is triggered by a control signal (X/XW).

11. Switched mode power supply according to claim 1, characterized in that the control signal (X/XW) is coupled back free of voltage potential from the side of the output control voltage ($U_B$), particularly by an optical coupling device (OK), into the control loop of the switching regulator (1).

12. Switched mode power supply according to claim 11, characterized in that the optical coupling device (OK) is connected on the secondary side with the base of the flip-flop transistor ($T_2$) on the one hand, and advantageously with a voltage divider tap between two individual resistors ($R_{G2}$, $R_B$ or $R_{G21}$, $R_{G22}$) of the active dropping resistor ($R_G$) on the other hand.

13. Switched mode power supply according to claim 10, characterized in that, the base of the flip-flop transistor ($T_2$) is connected with the drain terminal (D) of the switching component ($T_1$) by a series RC component ($R_T$, $C_T$) on one hand, and, by a dropping resistor ($R_V$) in particular, with a breakover point between the control resistor ($R_M$) and the source terminal (S) of the switching component ($T_1$) on the other hand.

14. Switched mode power supply according to claim 10, characterized in that the flip-flop transistor ($T_2$) with its collector-emitter connection lies between the gate terminal (G) of the switching component ($T_1$), in particular a voltage divider tap between two individual resistors ($R_B$ and $R_{G2}$ or $R_{G22}$), on the one hand, and the negative line (−) on the other hand.

15. Switched mode power supply according to claim 10, characterized in that a Zener diode ($D_Z$) is parallel to the collector-emitter connection of the flip-flop transistor ($T_2$).

16. Switched mode power supply according to claim 13, characterized in that the series RC component ($R_T$, $C_T$) has a resistor composed as a voltage divider of two component resistors ($R_{T1}$, $R_{T2}$), whereby its middle tap is connected with the negative line (−) by a protective diode ($D_Z$).

* * * * *